United States Patent [19]
Watkins et al.

[11] Patent Number: 5,715,822
[45] Date of Patent: Feb. 10, 1998

[54] MAGNETIC RESONANCE DEVICES SUITABLE FOR BOTH TRACKING AND IMAGING

[75] Inventors: Ronald Dean Watkins, Niskayuna; Charles Lucian Dumoulin, Ballston Lake, both of N.Y.

[73] Assignee: General Electric Company, Schenectady, N.Y.

[21] Appl. No.: 535,695

[22] Filed: Sep. 28, 1995

[51] Int. Cl.$^6$ ................................................. A61B 5/055
[52] U.S. Cl. ...................... 128/653.5; 128/899; 324/318
[58] Field of Search ........................ 128/653.2, 653.5, 128/899; 324/318, 322

[56] References Cited

U.S. PATENT DOCUMENTS

| | | | |
|---|---|---|---|
| 4,924,868 | 5/1990 | Krause et al. | 128/653.5 |
| 5,216,367 | 6/1993 | Mori | 128/653.5 |
| 5,307,808 | 5/1994 | Dumoulin et al. | 128/653.2 |
| 5,318,025 | 6/1994 | Dumoulin et al. | 128/653.2 |
| 5,409,003 | 4/1995 | Young | 128/653.5 |
| 5,462,055 | 10/1995 | Casey et al. | 128/653.5 |

*Primary Examiner*—Ruth S. Smith
*Attorney, Agent, or Firm*—Lawrence P. Zale; Marvin Snyder

[57] ABSTRACT

A novel RF coil attached to an invasive device, such as a catheter, is used to detect magnetic resonance (MR) signals for monitoring the position of the device within a subject and for the acquisition of high-resolution magnetic resonance images of the tissue surrounding the device. The novel coil is sensitive to a small volume of MR active tissue during tracking procedures, but is sensitive to a larger volume during imaging procedures. During tracking, the MR signals are detected in the presence of magnetic field gradients and thus have frequencies which are substantially proportional to the location of the coil along the direction of the applied gradient. Signals are detected responsive to applied magnetic gradients to determine the position of the coil in several dimensions. The position of the novel coil, and hence the device, as determined by the tracking system is superimposed upon independently acquired medical diagnostic images. Magnetic Resonance images of the tissue surrounding the novel coil can be obtained by detecting the MR response signals from the novel coil using gradient-recalled, spin-echo or other MR imaging sequences.

12 Claims, 4 Drawing Sheets

1

MAGNETIC RESONANCE DEVICES SUITABLE FOR BOTH TRACKING AND IMAGING

FIELD OF THE INVENTION

The present invention relates to medical procedures in which a device such as a catheter or biopsy needle is inserted into a body, and more particularly concerns tracking of such a device with magnetic resonance (MR) and the acquisition of high resolution radiographic images of tissue surrounding the device.

DESCRIPTION OF THE RELATED ART

Following a device placed within the body is an important aspect of many diagnostic and therapeutic applications. Often it is desirable to select a device which can be used to create images of the device's immediate surroundings. These images can be acquired using visible light, ultrasound, or magnetic resonance. One medical application of such imaging devices is the acquisition of high-resolution magnetic resonance images of blood vessel walls for the visualization and differentiation of various types of tissue and plaques. For this application the imaging device is incorporated into a catheter which is placed within a selected blood vessel. Magnetic Resonance Imaging is well suited for tissue differentiation, but when small receive coils are used to obtain images over small fields-of-view, it is necessary to accurately know the location of the receive coils to insure that the desired region of anatomy is within the field-of-view.

Currently, there is a need for a simple method of tracking an MR imaging device in an MR imaging system which requires little modification to the existing system. MR tracking methods which require minimal modification of a imaging system has been previously disclosed by U.S. Pat. No. 5,307,808 Dumoulin et al. "Tracking System And Pulse Sequences To Monitor The Position Of A Device Using Magnetic Resonance" issued May 3, 1994; and U.S. Pat. No. 5,318,025 Dumoulin et al. "Tracking System To Monitor The Position And Orientation Of A Device Using Multiplexed Magnetic Resonance Detection" issued Jun. 7, 1994. These methods employ a detected MR response signal to determine the location of a device in the body. Position information is obtained in three orthogonal directions by subsequent measurement of data for each orthogonal dimension.

A limitation of the MR tracking systems disclosed by the above-referenced patents is that the receive coil used to determine position has a limited region of sensitivity to minimize positional errors. Consequently, MR images of tissue surrounding the tracking coil have a limited field-of-view when the images are made with the tracking coil. Currently, there is a need to have an invasive device which can be tracked with MR and be used to create high-resolution MR images of its surroundings

SUMMARY OF THE INVENTION

An invasive device such as a catheter is positioned within a subject, and followed in real-time with a magnetic resonance (MR) imaging system comprised of a magnet, pulsed magnetic field gradient system, a radio-frequency transmitter, a radio-frequency receiver and a controller. The device to be tracked incorporates a small radio-frequency (RF) coil of a novel design near its end which can be used for both tracking and imaging. The MR system generates a series of RF and magnetic field gradient pulses which induce a resonant MR response signal from selected nuclear spins within the subject. This response signal induces current in the RF coil attached to the device. During device tracking, the spatial sensitivity of the RF coil is small and only nuclear spins in the immediate vicinity of the RF coil are detected by the RF coil. During imaging, however, the spatial sensitivity of the RF coil is made larger to accommodate the field-of-view of the image. Switching the sensitive volume of the coil is performed in response to signals from the controller.

OBJECTS OF THE INVENTION

It is an object of the present invention to provide a system for tracking an MR imaging coil within a body using magnetic resonance.

It is another object of the present invention to provide a method of tracking a device in a living body during an MR examination.

It is another object of the present invention to provide a high-resolution MR image of tissue surrounding a catheter which has been placed under MR guidance.

BRIEF DESCRIPTION OF THE DRAWINGS

The features of the invention believed to be novel are set forth with particularity in the appended claims. The invention itself, however, both as to organization and method of operation, together with further objects and advantages thereof, may be best understood by reference to the following description taken in conjunction with the accompanying drawing in which.

DETAILED DESCRIPTION OF THE INVENTION

Figure 1:
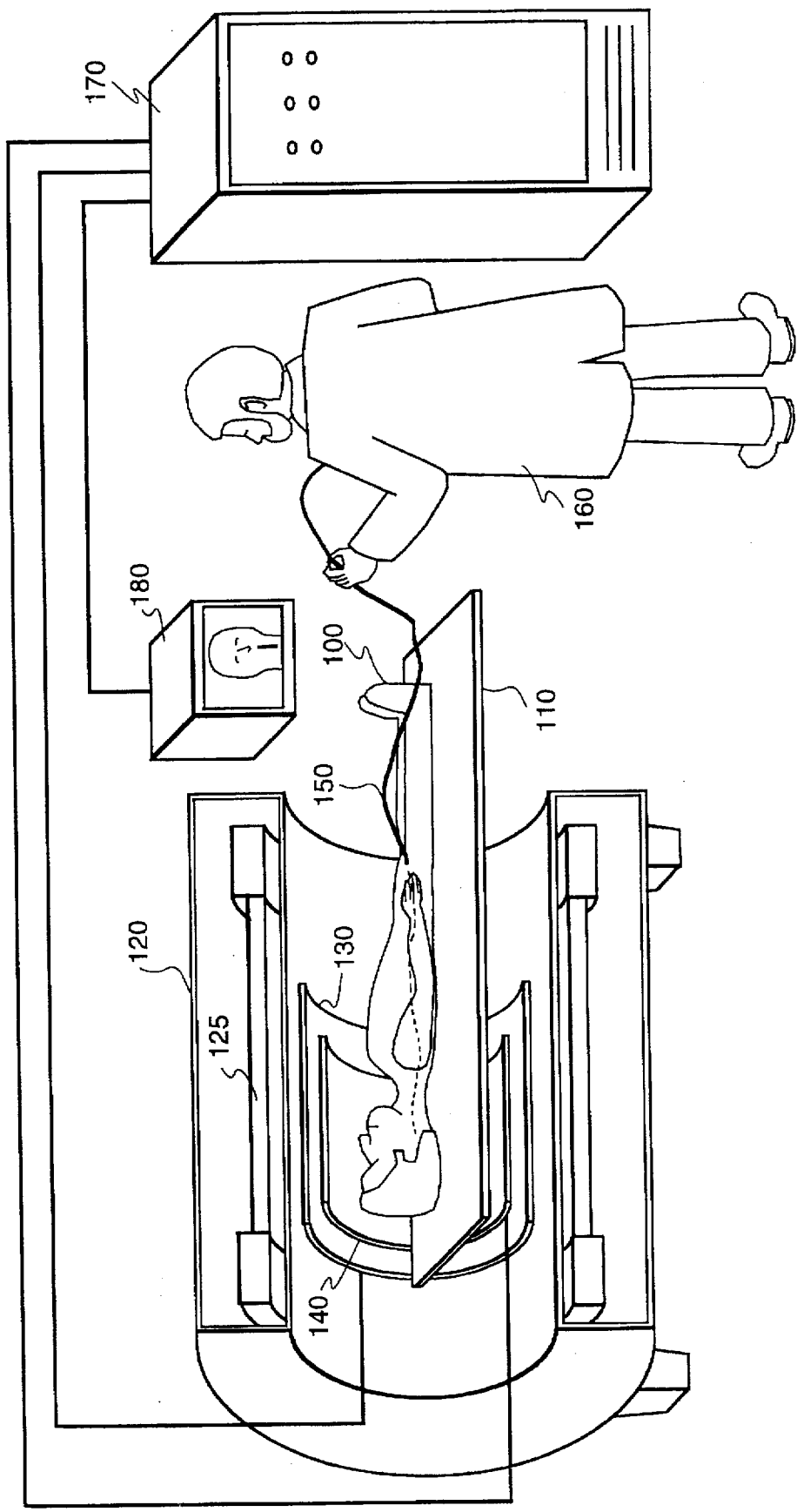
FIG. 1 is a perspective view of one embodiment of the present invention in operation tracking the location of a device in a subject.

In FIG. 1, a subject 100 on a support table 110 is placed in a homogeneous magnetic field generated by a magnet 125 in magnet housing 120. Magnet 125 and magnet housing 120 have cylindrical symmetry and are shown sectioned in half to reveal the position of subject 100. A region of subject 100 into which a device 150, shown as a catheter, is inserted, is located in the approximate center of the bore of magnet 125. Subject 100 is surrounded by a set of cylindrical magnetic field gradient coils 130 which create magnetic field gradients of predetermined strength at predetermined times. Gradient coils 130 generate magnetic field gradients in three mutually orthogonal directions.

An external coil 140 also surrounds the region of interest of subject 100. Coil 140 is shown as a cylindrical external coil which has a diameter sufficient to encompass the entire subject. Other geometries, such as smaller cylinders specifically designed for imaging the head or an extremity can be used instead. Non-cylindrical external coils, such as surface coils, may alternatively be used. External coil 140 radiates radio frequency energy into subject 100 at predetermined times and with sufficient power at the predetermined frequency that nutates nuclear magnetic spins of subject 100 in a fashion well known to those skilled in the art. The nutation of the spins causes them to resonate at the Larmor frequency. The Larmor frequency for each spin is directly proportional to the strength of the magnetic field experienced by the spin. This field strength is the sum of the static magnetic field generated by magnet 125 and the local field generated by magnetic field gradient coil 130.

Device 150 is inserted into subject 100 by an operator 160, and may be a guide wire, a catheter, an endoscope, a laparoscope, a biopsy needle, surgical implement, therapy delivery implement or similar device. Device 150 may be tracked according to the method disclosed in the above-referenced U.S. Pat. No. 5,307,808 Dumoulin et al. This device contains an RF coil which detects MR signals generated in the subject responsive to the radio frequency field created by external coil 140. Since the RF coil is small, the region of sensitivity is also small. Consequently, the detected signals have Larmor frequencies which arise only from the strength of the magnetic field in the immediate vicinity of the coil. These detected signals are sent to an imaging and tracking unit 170 where they are analyzed. The position of device 150 is determined in imaging and tracking unit 170 and is displayed on a display means 180. In the preferred embodiment of the invention the position of device 150 is displayed on display means 180 by superposition of a graphic symbol on a conventional MR image driven by a superposition means (not shown). In alternative embodiments of the invention, the graphic symbol representing device 150 is superimposed on diagnostic images obtained with other imaging systems such as a computed tomography (CT) scanner, a Positron Emission Tomography system or ultrasound scanner. Other embodiments of the invention display the position of the device numerically or as a graphic symbol without reference to a diagnostic image.

Figure 2B:
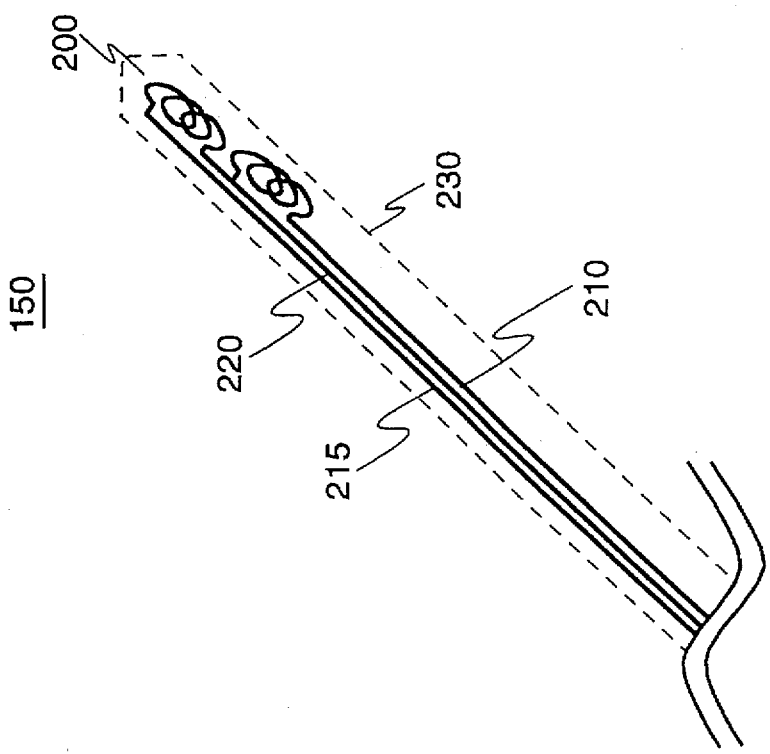
FIG. 2b is a perspective drawing showing the incorporation of the combination tracking and imaging coil into a catheter.
Figure 2A:
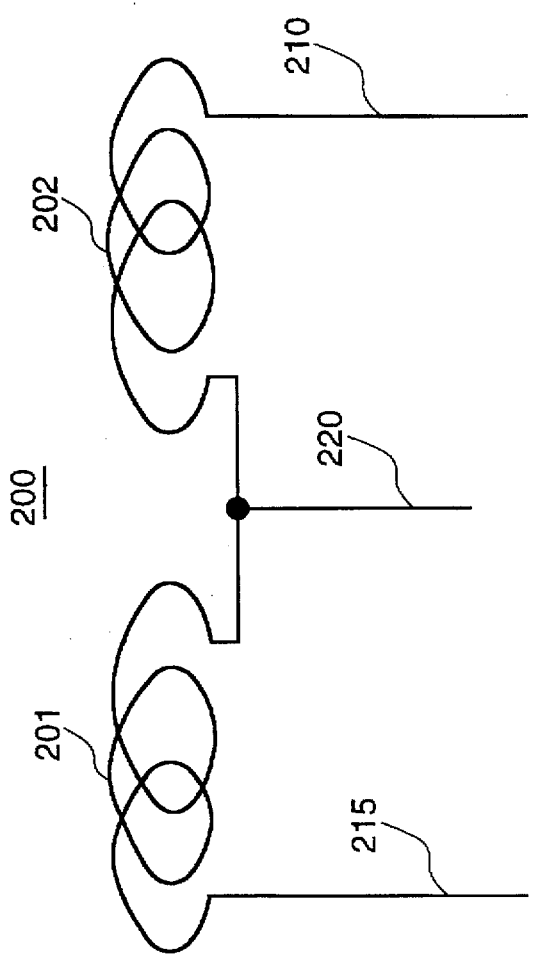
FIG. 2a is a schematic illustration showing an RF coil suitable for both tracking and imaging.

An embodiment of device 150 is shown in greater detail in FIGS. 2a and 2b. A small RF coil 200 is electrically coupled to the MR system via a first conductor 210, a second conductor 215 and a third conductor 220 so that first winding section 201 is directly attached to conductors 215 and 220, and a second winding section 202 is directly attached to conductors 220 and 210. In a preferred embodiment of this invention, conductors 210 and 215 are surrounded and separated by conductor 220 to form a pair of co-axial cables with a shared outer shield. Other embodiments in which conductors 210 and 215 are surrounded, but not separated by third conductor 220 are also possible. Conductors 210, 215, 220 and RF coil 200 are encased in an outer shell 230 of device 150 as shown in FIG. 2b.

In a preferred embodiment of the invention, MR response signals from first conductor 210, second conductor 215 and third conductors 220 are used for either tracking or imaging purposes. If detection of tracking signals is desired, then signals are detected from first conductor 210 using third conductor 220 as a current return path. The MR response signal sensed is used to compute a first tracking position. MR response signals from second conductor 215 using third conductor 220 as a current return path are employed in computing a second tracking position. First and second tracking positions correspond to two different locations on device 150 and can be used to determine the orientation of device 150 if desired.

If detection of imaging signals is desired, however, then signals from first conductor 210 are detected using second conductor 215 as a current return path. MR response signals acquired in this fashion are acquired from a larger region around device 150 than those acquired during MR tracking. In one embodiment of the current invention, the winding direction of the portion of coil 200 between first conductor 210 and third conductor 220 is selected to be opposite that of the winding direction of the portion of coil 200 between third conductor 220 and second conductor 215. This enhances the sensitivity distance from device 150.

Figure 3A:
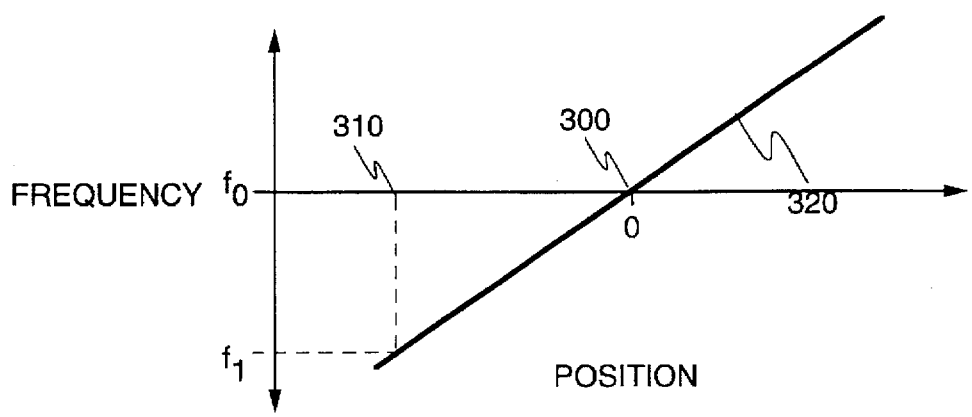
FIG. 3a is a graph of MR resonance frequency vs. position along a single axis in the presence of an applied magnetic field gradient.

Referring now to FIG. 3a, the Larmor frequency of a spin is shown to be substantially proportional to its position when a magnetic field gradient is applied. A spin located at a center point 300 of gradient coil 130 (FIG. 1) precesses at a Larmor frequency $f_0$. The Larmor frequency $f_0$ at point 300 is determined solely by the static magnetic field generated by magnet 125 (FIG. 1). A spin at a location 310 has a Larmor frequency $f_1$ determined by the sum of the static magnetic field and the additional magnetic field created at that location by magnetic field gradient coil 130 (FIG. 1). Since the gradient coil response 320 is substantially linear, the Larmor frequency of the spin is substantially proportional to position.

The MR signal response from an MR active object subjected to the magnetic field gradient shown in FIG. 3a is a function of both the magnetic field gradient and the spatial sensitivity of the RF coil used to detect the MR signals.

Figure 3B:
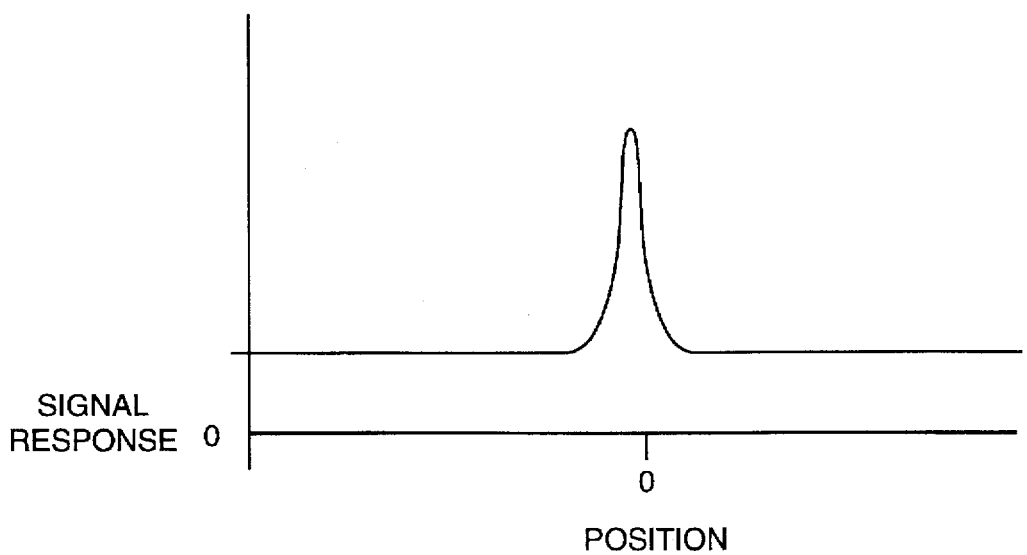
FIG. 3b is a graph of coil sensitivity vs. position for the combined tracking and imaging coil when the combined coil is used for tracking the catheter.

FIG. 3b illustrates a typical spatial sensitivity profile for coil 200 when MR signals are detected from first conductor 210 with third conductor 220 used as the current return path.

Figure 3C:
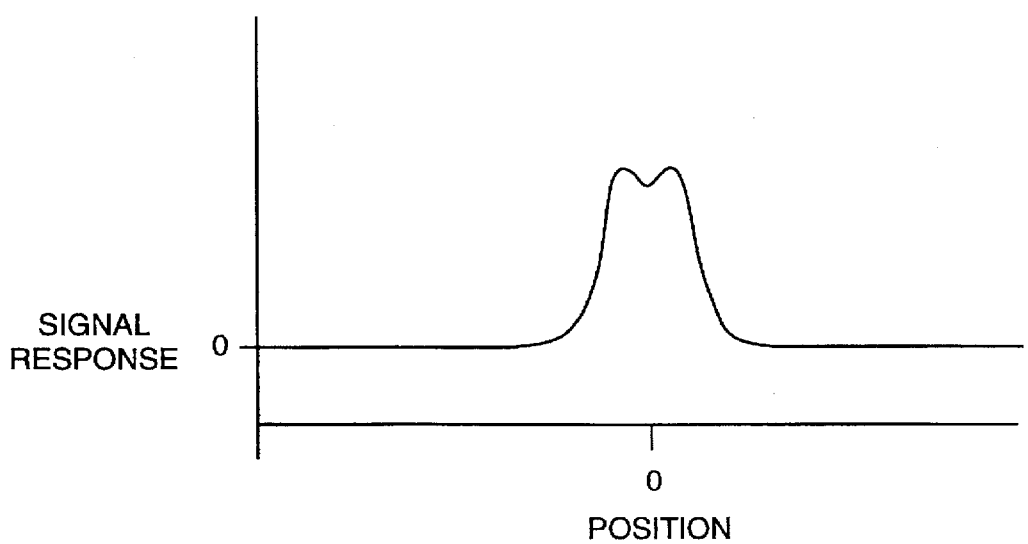
FIG. 3c is a graph of coil sensitivity vs. position for the combined tracking and imaging RF coil when the combined coil is used for obtaining magnetic resonance images from tissue surrounding the catheter.

FIG. 3c illustrates a typical spatial sensitivity profile for coil 200 when MR signals are detected from first conductor 210 with second conductor 215 used as the current return path. Note that the spatial response profile in FIG. 3c is greater than that of FIG. 3b. The larger profile of FIG. 3c is advantageous for imaging use, while the smaller profile of FIG. 3b is advantageous for tracking use.

The RF coil of FIG. 2a, shows two connected winding sections, 201,202. The first conductor 210 is connected to one end of winding section 202. The second conductor 215 is connected to the opposite end of winding section 201. At least one conductor 220 is connected to the RF coil between the winding sections. In the embodiment disclosed here, RF coil 200 has two winding sections. Other embodiments in which coil 200 has a greater number of winding sections are also possible and could be used to provide additional tracking information and larger sensitive volumes for imaging.

Figure 4:
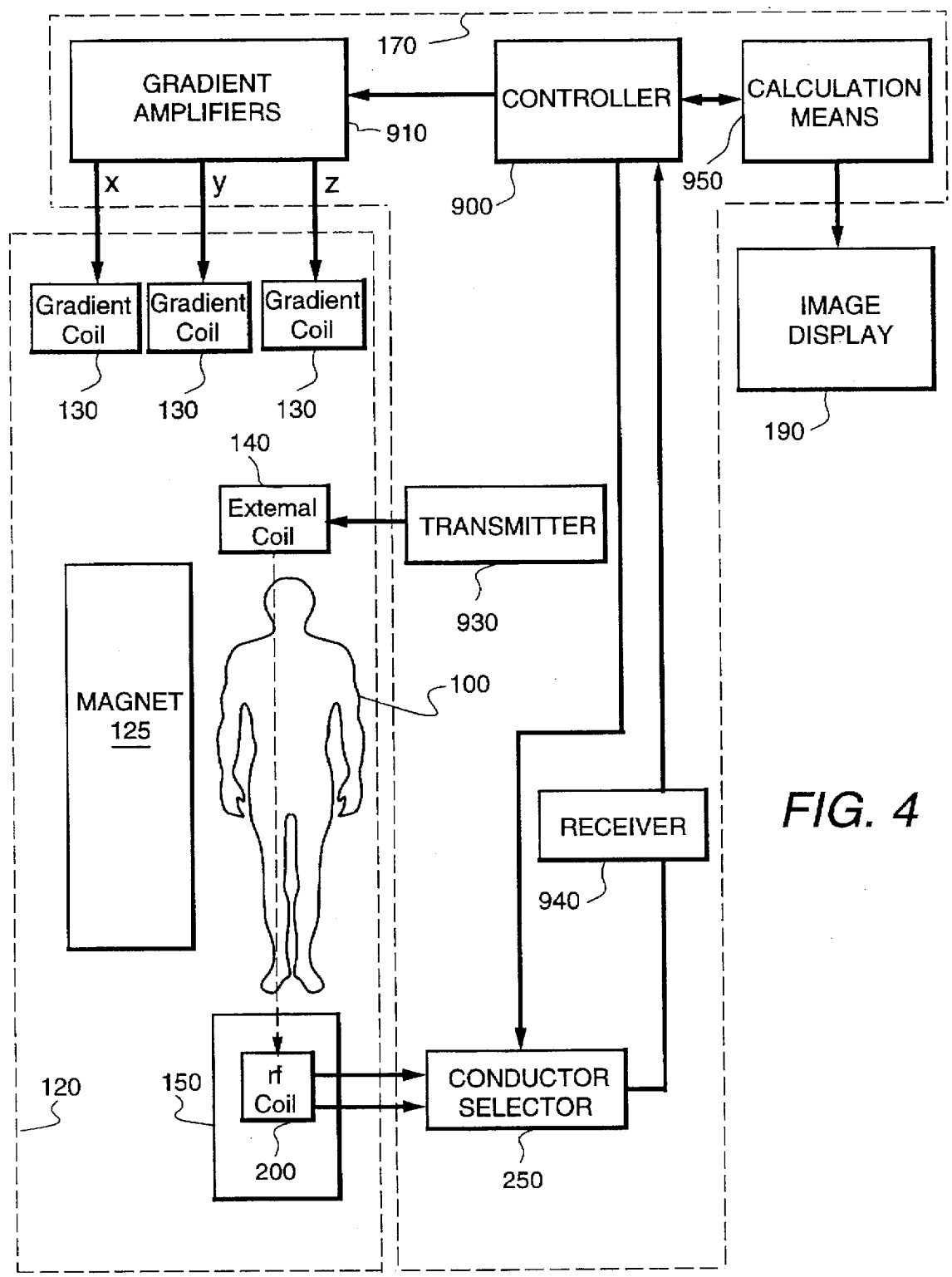
FIG. 4 is a block diagram of an MR imaging system suitable for device tracking using the present invention.

In FIG. 4, conductor selector 250 operates in either of two modes, an imaging mode or a tracking mode. Operating in its imaging mode conductor selector 250 selects a pair of conductors based upon a desired field-of-view, a larger field-of-view being obtained by selecting conductors attached to coil windings having a larger physical separation. MR response signals from subject 100 are sensed by the winding sections between the selected pair of conductors.

Conductor selector 250 also operates in a tracking mode, selecting at least one pair of conductors, and receiving an MR response signal from winding sections between the selected conductors. Typically, a single point is desired to be located, and therefore it is advantageous to receive MR response signals from a small number of winding sections, possibly one section, to determine a location. Also, several locations can be tracked to determine the location of multiple winding sections to determine the orientation of device 150 as disclosed in the above-referenced U.S. Pat. No. 5,318,025 Dumoulin et al. issued Jun. 7, 1994.

Because of reciprocity, the transmit and receive functions of the RF coils may be reversed, if desired. It is also possible to use each MR response signal for both transmit and receive functions, multiplexed in time.

FIG. 4 is a block diagram of an MR system suitable for imaging and device tracking. The system comprises a controller 900 which provides control signals to a set of magnetic field gradient amplifiers 910. These amplifiers drive magnetic field gradient coils 130 situated within the magnet enclosure 120 (FIG. 1). Gradient coils 130 are capable of generating magnetic field gradients in three mutually orthogonal directions. Controller 900 also generates signals which are sent to a transmitter means 930. These signals from controller 900 cause transmitter means 930 to generate RF pulses at a selected frequency and of suitable power to nutate selected spins in the region of the subject situated within external coil 140 which, in turn, is situated within the bore of magnet 125. An MR signal is induced in RF coil 200, (FIG. 2) connected to a receiver means 940. Receiver means 940 is capable of accepting MR signals from first conductor 210 with third conductor 220 as a current return path for tracking use. Alternatively, receiver means 940 can accept MR signals from first conductor 210 with second conductor 215 as a current return path for imaging use. Selection of which conductors are used by receiver 940 is determined by controller 900.

Receiver means 940 processes the MR signal by amplifying, demodulating, faltering and digitizing it. Controller 900 also collects signals from receiver means 940 and propagates it to a calculation means 950 where it is processed. When used for tracking calculation means 950 applies a Fourier transformation to the signal received from controller 900 to arrive at a position of coil 200. When used for imaging calculation means 950 applies a Fourier transformation to the signal received from controller 900 to obtain an image of the tissue surrounding coil 200. The results calculated by calculation means 950 are displayed on an image display means 180.

MR imaging and device tracking can be performed with much of the same hardware system if desired. It is also possible to interleave image acquisition with tracking so that both are performed approximately at the same time. Alternatively, simultaneous tracking and imaging can be done without interleaving by analyzing the gradient waveforms of an imaging procedure and the MR response signal detected by RF coil 200 within device 150 to determine the location of device 150.

In a preferred embodiment of the invention, RF coil 200 located within device 150 performs a receive function. Reciprocity between the transmit and receive coils exists, however, and tracking systems in which RF coil 200 in device 150 is used to transmit RF energy, and external coil 140 is used to receive the MR response signal are possible.

While several presently preferred embodiments of the novel MR tracking system have been described in detail herein, many modifications and variations will now become apparent to those skilled in the art. It is, therefore, to be understood that the appended claims are intended to cover all such modifications and variations as fall within the true spirit of the invention.

What is claimed is:

1. A tracking and imaging subsystem for use in a magnetic resonance (MR) imaging device having a calculation device capable of calculating MR source locations and images from MR response signals passed to it comprising:

a) an interventional device intended to be inserted into a subject;

b) an RF coil subsystem having:
  i. a plurality of connected winding sections within the interventional device;
  ii. a first conductor connected to a first end of the connected winding sections;
  iii. a second conductor connected to a second end of the connected winding sections;
  iv. at least one conductor between the winding sections;

c) a conductor selector adapted to be coupled to said calculation device for operating in an imaging mode by selecting a pair of conductors based upon a desired field-of-view of an image, and for passing an MR response signal sensed by the winding sections between the selected pair of conductors to said calculation device, the conductor selector capable of also operating in a tracking mode by selecting a plurality of adjacent pairs of conductors, and passing a different MR response signal from each corresponding winding to said calculation device to result in a plurality of tracked locations.

2. The tracking and imaging subsystem recited in claim 1 further comprising:

a superposition device for superimposing a symbol on the image at a position representing the location of said interventional device determined by the calculation device.

3. The tracking and imaging subsystem recited in claim 1, wherein the interventional device comprises one of the group consisting of a guide wire, a catheter, an endoscope, a laparoscope and a biopsy needle.

4. The tracking and imaging subsystem recited in claim 1, wherein the interventional device comprises a surgical implement.

5. The tracking and imaging subsystem recited in claim 1, wherein the interventional device comprises a therapeutic device.

6. The tracking and imaging subsystem recited in claim 1 wherein each of the winding sections has coincident substantially parallel axes through the windings, and are wound in a direction opposite to its adjacent winding section resulting in a coil arrangement with an increased sensitivity perpendicular to the coincident axes.

7. A tracking and imaging subsystem for use in a magnetic resonance (MR) imaging device having an RF transmission device for transmitting energy through connected RF coils, and a calculation device capable of calculating MR source locations and images from MR response signals passed to it comprising:

a) an interventional device intended to be inserted into a subject;

b) an RF coil subsystem having:
  i. a plurality of connected winding sections within the interventional device;
  ii. a first conductor connected to a first end of the connected winding sections;
  iii. a second conductor connected to a second end of the connected winding sections;
  iv. at least one conductor between the winding sections;

c) a conductor selector operating in an imaging mode for selecting a pair of conductors corresponding to a desired excitation volume, and for connecting the conductors to the RF transmission device thereby passing energy through the winding sections between the selected pair of conductors, the conductor selector also operating in a tracking mode, for connecting a plurality of adjacent pairs of conductors to the RF transmission device, and for transmitting RF energy through a plurality of winding sections between the selected conductors simultaneously, so as to provide several small point sources capable of being easily tracked.

8. The tracking and imaging subsystem recited in claim 7 wherein each of the winding sections has coincident substantially parallel axes through the windings, and are wound in a direction opposite to its adjacent winding section resulting in a coil arrangement with an increased transmission perpendicular to the coincident axes.

9. The magnetic resonance tracking system recited in claim 7 further comprising:

a superposition device for superimposing a symbol on the image at a position representing the location of said interventional device determined by the calculation device.

10. The tracking and imaging subsystem recited in claim 7, wherein the interventional device comprises one of the group consisting of a guide wire, a catheter, an endoscope, a laparoscope and a biopsy needle.

11. The tracking and imaging subsystem recited in claim 7, wherein the interventional device comprises a surgical implement.

12. The tracking and imaging subsystem recited in claim 7, wherein the interventional device comprises a therapeutic device.

* * * * *